United States Patent
Gershon et al.

(10) Patent No.: US 10,573,814 B2
(45) Date of Patent: Feb. 25, 2020

(54) TECHNIQUES FOR PEROVSKITE LAYER CRYSTALLIZATION

(71) Applicant: International Business Machines Corporation, Armonk, NY (US)

(72) Inventors: Talia S. Gershon, White Plains, NY (US); Supratik Guha, Chicago, IL (US); Oki Gunawan, Westwood, NJ (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/378,268

(22) Filed: Apr. 8, 2019

(65) Prior Publication Data

US 2019/0237667 A1  Aug. 1, 2019

Related U.S. Application Data

(62) Division of application No. 14/449,420, filed on Aug. 1, 2014, now Pat. No. 10,297,754.

(51) Int. Cl.
*H01L 31/18* (2006.01)
*H01L 51/00* (2006.01)
*H01L 31/04* (2014.01)
*G01J 3/46* (2006.01)

(52) U.S. Cl.
CPC ............ *H01L 51/001* (2013.01); *G01J 3/463* (2013.01); *H01L 31/04* (2013.01); *H01L 31/18* (2013.01); *H01L 51/0031* (2013.01); *Y02E 10/549* (2013.01)

(58) Field of Classification Search
CPC ... H01L 31/04; H01L 51/001; H01L 51/0031; H01L 31/18; Y02E 10/549
See application file for complete search history.

(56) References Cited

U.S. PATENT DOCUMENTS

| | | | |
|---|---|---|---|
| 5,871,579 A * | 2/1999 | Liang | C23C 2/04 117/54 |
| 6,117,498 A | 9/2000 | Chondroudis et al. | |
| 6,180,956 B1 | 1/2001 | Chondroudis et al. | |
| 6,429,318 B1 | 8/2002 | Mitzi | |
| 6,667,070 B1 | 12/2003 | Adem | |

(Continued)

OTHER PUBLICATIONS

S. Stranks et al., "Electron-Hole Diffusion Lengths Exceeding 1 Micrometer in an Organometal Trihalide Perovskite Absorber," Science, vol. 342, No. 6156, 2013, pp. 341-344 (Oct. 2013).

(Continued)

*Primary Examiner* — Michael M Trinh
(74) *Attorney, Agent, or Firm* — Vazken Alexanian; Michael J. Chang, LLC (57) ABSTRACT

Vacuum annealing-based techniques for forming perovskite materials are provided. In one aspect, a method of forming a perovskite material is provided. The method includes the steps of: depositing a metal halide layer on a sample substrate; and vacuum annealing the metal halide layer and methylammonium halide under conditions sufficient to form methylammonium halide vapor which reacts with the metal halide layer and forms the perovskite material on the sample substrate. A perovskite-based photovoltaic device and method of formation thereof are also provided.

20 Claims, 7 Drawing Sheets

(56) References Cited

U.S. PATENT DOCUMENTS

| | | | |
|---|---|---|---|
| 6,676,749 B2* | 1/2004 | Era | C30B 7/00 117/68 |
| 8,574,953 B2 | 11/2013 | DeHaven et al. | |
| 9,331,292 B2* | 5/2016 | Irwin | H01G 9/2027 |
| 9,997,707 B2* | 6/2018 | Wang | H01L 51/424 |
| 2008/0268137 A1 | 10/2008 | Ikeda et al. | |
| 2015/0377702 A1 | 12/2015 | Bojarczuk et al. | |
| 2016/0005987 A1* | 1/2016 | Koposov | H01L 51/4226 136/263 |
| 2016/0111575 A1* | 4/2016 | Han | H01L 31/0384 |

OTHER PUBLICATIONS

M. Liu et al., "Efficient planar heterojunction perovskite solar cells by vapour deposition," Nature vol. 501, No. 7467, 395-398 (Sep. 2013).

J. Burschka et al., "Sequential deposition as a route to high-performance perovskite-sensitized solar cells," Nature, vol. 499, No. 7458, pp. 316-319 (Jul. 2013).

D. Liu et al., "Perovskite solar cells with a planar heterojunction structure prepared using room-temperature solution processing techniques," Nature Photonics, 8, 133-138 (2014) (published Dec. 2013).

Q. Chen et al., "Planar Heterojunction Perovskite Solar Cells via Vapor-Assisted Solution Process," J. Am. Chem. Soc. 2014, vol. 136, No. 2, pp. 622-625 (published Dec. 2013).

Q. Chen et al., "Planar Heterojunction Perovskite Solar Cells via Vapor-Assisted Solution Process," J. Am. Chem. Soc. 2014, vol. 136, No. 2, pp. 622-625 (published Dec. 2013)—supporting information (SI).

Y. Zhao et al., "Effective hole extraction using MoOx-Al contact in perovskite CH3NH3PbI3 solar cells," Applied Physics Letters, vol. 104, No. 21, May 2014, 213906 (4 pages).

Y. Zhao et al., "CH3NH3Cl-Assisted One-Step Solution Growth of CH3NH3PbI3: Structure, Charge-Carrier Dynamics, and Photovoltaic Properties of Perovskite Solar Cells," The Journal of Physical Chemistry C, vol. 118, No. 18, Apr. 2014, pp. 9412-9418.

Peng et al., "A hybrid physical-chemical deposition process at ultra-low temperatures for high-performance perovskite solar cells," J. Mater. Chem. A, 3(23), 12436-12442 (Jun. 2015).

Hao et al., "Anomalous Band Gap Behavior in Mixed Sn and Pb Perovskites Enables Broadening of Absorption Spectrum in Solar Cells," Journal of the American Chemical Society, 136(22), 8094-8099 (May 2014).

Ha et al., "Synthesis of Organic-Inorganic Lead Halide Perovskite Nanoplatelets: Towards High-Performance Perovskite Solar Cells and Optoelectronic Devices," Advanced Optical Materials, 2: 838-844 (May 2014).

List of IBM Patents or Applications Treated as Related (2 pages).

* cited by examiner

TECHNIQUES FOR PEROVSKITE LAYER CRYSTALLIZATION

CROSS-REFERENCE TO RELATED APPLICATION(S)

This application is a divisional of U.S. application Ser. No. 14/449,420 filed on Aug. 1, 2014, now U.S. Pat. No. 10,297,754 the disclosure of which is incorporated by reference herein.

FIELD OF THE INVENTION

The present invention relates to perovskite layer crystallization and more particularly, to solution-based, vacuum annealing techniques for forming perovskite materials.

BACKGROUND OF THE INVENTION

Solar cells based on $CH_3NH_3MX_3$ and analogous metal (e.g., M=Pb or Sn) halide-based (hereinafter X or "halide"=F, Cl, Br, I or any combination thereof) materials with perovskite structure (referred to herein as "perovskites") have demonstrated exceptional photovoltaic conversion efficiency and are among the most actively researched emerging photovoltaic technologies for future large-scale applications. Different deposition methods for perovskites have been reported, each with specific advantages and limitations.

For example, one deposition technique involves solution deposition from halide-$CH_3NH_3I$ solutions. See, for example, S. Stranks et al., "Electron-Hole Diffusion Lengths Exceeding 1 Micrometer in an Organometal Trihalide Perovskite Absorber," Science, Vol. 342 (October 2013) (hereinafter "Stranks"). While applicable for large-area printing applications, this approach described in Stranks does not readily produce continuous films. Further, most high-efficiency devices employing such a solution deposition approach rely on an additional nanoparticle scaffold of $TiO_2$ or $Al_2O_3$ in order to minimize shunting effects. Such scaffolds typically require high sintering temperatures (e.g., exceeding 450 degrees Celsius (° C.)) for optimal performance which makes them inapplicable for tandem device structures on top of materials with low tolerance to temperatures above 200° C. (e.g., CIGS bottom cells).

Another deposition technique involves the co-evaporation of $PbCl_2$ and $CH_3NH_3I$. See, for example, M. Liu et al., "Efficient planar heterojunction perovskite solar cells by vapour deposition," Nature vol. 501, 395-398 (September 2013). While yielding high quality continuous films, co-evaporation with precise control of multiple fluxes is challenging and expensive to transfer to large-area manufacturing.

Yet another deposition technique involves the sequential solution deposition of lead halide and dipping in methylammonium iodide. See, for example, J. Burschka et al., "Sequential deposition as a route to high-performance perovskite-sensitized solar cells," Nature, Vol. 499, 316 (July 2013) (hereinafter "Burschka"). Convenient, fast and scalable, this method however could only produce full conversion to the desired phase in devices employing additional nanoparticle scaffold of $TiO_2$ (see Burschka) which, as provided above, requires high sintering temperature and thus makes the process inapplicable for device structures with a low tolerance to elevated temperatures. D. Liu et al., "Perovskite solar cells with a planar heterojunction structure prepared using room-temperature solution processing techniques," Nature Photonics, 8, 133-138 (2014) (published December 2013) reports using ZnO as a support layer which can be processed at low temperatures since it does not require sintering. However, perovskite films were found to be highly reactive with ZnO films even at temperatures as low as 80° C. which could render these devices unsuited for outdoor applications.

Still yet another deposition technique involves sequential solution deposition and vapor anneal. See, for example, Q. Chen et al., "Planar Heterojunction Perovskite Solar Cells via Vapor-Assisted Solution Process," J. Am. Chem. Soc. 2014, 136, 622-625 (hereinafter "Chen") and associated supporting information (SI) (published December 2013). According to Chen, lead halide film samples were annealed for several hours at 150° C. on a hot plate, surrounded by $CH_3NH_3I$ and covered by a Petrie dish at atmospheric pressure. See, for example, FIG. S1 in the associated supporting information of Chen. The temperature employed by this approach in Chen, especially for such a long duration may however be too high for many solar cell structures, including structures on Poly(3,4-ethylenedioxythiophene) (PEDOT) hole transporting materials and tandem structures with other bottom cells. Attempts to reproduce the approach described in Chen also revealed poor uniformity of the conversion over larger substrates (i.e., substrates larger than the 1 inch×1 inch used in research devices).

Therefore, there exists a need for an effective, low-cost and scalable method for large-area fabrication of perovskite absorbers, including those requiring lower processing temperatures in order to be compatible with the other solar cell elements.

SUMMARY OF THE INVENTION

The present invention provides vacuum-annealing-based techniques for forming perovskite materials. In one aspect of the invention, a method of forming a perovskite material is provided. The method includes the steps of: depositing a metal halide layer on a sample substrate; and vacuum annealing the metal halide layer and methylammonium halide (e.g., selected from the group including: methylammonium iodide, methylammonium bromide, and methylammonium chloride) under conditions sufficient to form methylammonium halide vapor which reacts with the metal halide layer and forms the perovskite material on the sample substrate. According to an exemplary embodiment, the methylammonium halide is coated on a source substrate which is placed facing the metal halide layer during the vacuum annealing step at a distance d of about 0.2 millimeters to about 20 millimeters, and ranges therebetween away from the metal halide layer.

In another aspect of the invention, a method of forming a perovskite-based photovoltaic device is provided. The method includes the steps of: depositing a first hole transporting or electron transporting material onto an electrically conductive substrate; depositing a metal halide layer onto the first hole transporting or electron transporting material; vacuum annealing the metal halide layer and methylammonium halide under conditions sufficient to form methylammonium halide vapor which reacts with the metal halide layer and forms a perovskite material on the electrically conductive substrate; depositing a second hole transporting or electron transporting material onto the perovskite material which has an opposite polarity from the first hole transporting or electron transporting material; and depositing an electrically conductive material onto the second hole transporting or electron transporting material.

In yet another aspect of the invention, a perovskite-based photovoltaic device is provided. The perovskite-based photovoltaic device includes: a first electrically conductive material on a substrate; a first hole transporting or electron transporting material on the first electrically conductive material; a perovskite material formed on the first hole transporting or electron transporting material by depositing a metal halide layer on the first hole transporting or electron transporting material, and vacuum annealing the metal halide layer and methylammonium halide under conditions sufficient to form methylammonium halide vapor which reacts with the metal halide layer and forms the perovskite material on the first hole transporting or electron transporting material, wherein the perovskite material has a thickness T of from about 20 nm to about 300 nm, and ranges therebetween, and an average grain size that is greater than 0.5T; a second hole transporting or electron transporting material on the perovskite material which has an opposite polarity from the first hole transporting or electron transporting material; and a second electrically conductive material on the second hole transporting or electron transporting material.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming dense, device-quality perovskite layers which advantageously require significantly lower processing temperatures and/or shorter processing times than the above-described conventional approaches thus making the present process compatible with other temperature-sensitive solar cell elements. As will be described in detail below, the present process involves vacuum annealing metal halide films in the presence of a methylammonium halide vapor source to form perovskite layers on a given substrate.

As provided above, the term "perovskite" refers to materials with a perovskite structure and the general formula $ABX_3$ (e.g., wherein $A=CH_3NH_3$ or $NH=CHNH_3$, $B=$lead (Pb) or tin (Sn), and $X=$chlorine (Cl) or bromine (Br) or iodine (I)). The perovskite structure is described and depicted, for example, in U.S. Pat. No. 6,429,318 B1 issued to Mitzi, entitled "Layered Organic-Inorganic Perovskites Having Metal-Deficient Inorganic Frameworks" (hereinafter "Mitzi"), the contents of which are incorporated by reference as if fully set forth herein. As described in Mitzi, perovskites generally have an $ABX_3$ structure with a three-dimensional network of corner-sharing $BX_6$ octahedra, wherein the B component is a metal cation that can adopt an octahedral coordination of X anions, and the A component is a cation located in the 12-fold coordinated holes between the $BX_6$ octahedra. The A component can be an organic or inorganic cation. See, for example, FIGS. 1a and 1b of Mitzi.

Figure 1:
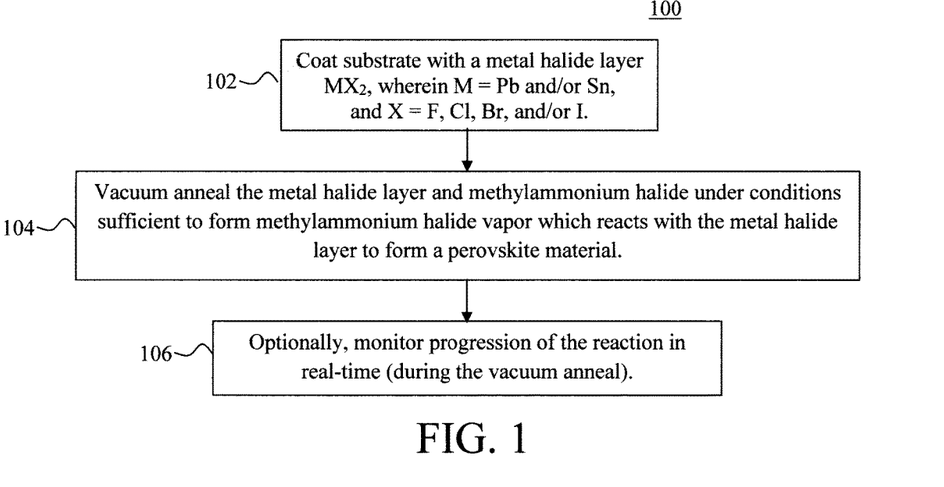
FIG. 1 is a diagram illustrating an exemplary methodology for forming a perovskite material using vacuum annealing according to an embodiment of the present invention.

The overall present process for forming a perovskite material is now described by way of reference to methodology 100 of FIG. 1. In step 102, a substrate is coated with a metal halide layer using, e.g., a suitable solution or vapor deposition process. Suitable metal halides include, but are not limited to, those compounds having the general formula $MX_2$, wherein M is Pb and/or Sn, and X is at least one of fluorine (F), Cl, Br, and I.

According to one particular exemplary embodiment, a "mixed" Pb/Sn halide perovskite is formed. Some advantages of this mixed configuration include: 1) it reduces the amount of lead going into the device (toxicity), and 2) it provides an extra means to control the band gap (Pb and Sn materials have different band gaps). By way of example only, to attain a blended Pb/Sn perovskite, the lead and tin iodide precursors can be blended and cast together (forming a mixed Pb/Sn metal halide film) before the vacuum annealing step. Alternatively, alternating Pb and Sn layers can be formed (deposit one and then the other) to achieve a graded band gap. Thus, according to an exemplary embodiment, M (in the above general formula for the metal halide) is both Pb and Sn, and the metal halide contains a mix or stack $Pb_mSn_{m-1}X_nY_{2-n}$, wherein X and Y are each at least one of F, Cl, Br, and I, and wherein $0<m<1$ and $0\leq n\leq 2$.

Throughout the description below, the component containing the metal halide film used to form the perovskite material will also be referred to herein generally as the "sample" and the methylammonium halide source (see below) will also be referred to herein generally as the "source." Thus, by way of example only, in this instance the substrate coated with the metal halide layer is the sample.

The present techniques can be used to form a perovskite material layer on any one of a number of different substrates.

By way of example only, the substrate coated with the metal halide layer in step 102 can be a component of a solar cell, such as an indium tin oxide (ITO)-coated glass to be used as a solar cell substrate. An exemplary implementation of the present techniques to form a perovskite absorber layer for a photovoltaic device is provided below. An exemplary apparatus for carrying out the present process which permits real-time monitoring of the reaction is provided below. The apparatus is configured to take real-time optical measurements of the sample as the reaction progresses using a spectrometer, wherein light is shone through the sample and picked-up by a photodetector. See, for example, FIG. 2—described below. Thus, in that case, it may be desirable to employ a substrate that is transparent to the desired frequency of light. By way of example only, suitable transparent substrates include, but are not limited to, glass and/or polymer sheets optionally coated with other functional layers with sufficient transparency such as ITO and/or poly(3, 4-ethylenedioxythiophene)-poly(styrenesulfonate) (PEDOT:PSS) as a hole transporting material. Alternatively, in the case where a non-transparent substrate is used, the reaction may still be monitored using real-time optical measurements. However a monitoring apparatus would instead be employed where light reflected from the sample is monitored as the reaction progresses. For instance, if the (non-transparent) substrate is formed from a light-reflecting material such as silver (Ag) or aluminum (Al), light incident on the sample and reflected back by the substrate can be detected and monitored. See, for example, FIG. 3—described below.

Next, in step 104, the metal halide layer is annealed under a vacuum in the presence of methylammonium halide under conditions (e.g., temperature, duration, pressure, etc.) sufficient to form methylammonium halide vapor which reacts with the metal halide layer to form a perovskite layer on the substrate. By way of example only, suitable methylammonium halides include, but are not limited to, methylammonium iodide, methylammonium bromide, and methylammonium chloride.

Performing the anneal under a vacuum facilitates higher partial vapor pressure and enhances diffusion of the methylammonium halide, thus advantageously permitting the present process to be performed at relatively lower temperatures and/or with shorter processing times when compared to conventional approaches employing atmospheric pressure (see above). Lower processing temperatures make the process compatible with temperature-sensitive device configurations such as tandem photovoltaic devices using perovskite absorbers over, e.g., CZT(S,Se)-based devices. See, for example, U.S. patent application Ser. No. 14/449,486, entitled "Tandem Kesterite-Perovskite Photovoltaic Device," the contents of which are incorporated by reference as if fully set forth herein.

By way of example only, a vacuum of less than about 50 Torr, e.g., from about $1 \times 10^{-6}$ millitor to about 50 Torr, and ranges therebetween, may be employed. As provided above, a vacuum facilitates the flow of fresh methylammonium halide vapor over the substrate, thus enabling lower processing temperatures. According to an exemplary embodiment, the present process is carried out at a temperature of from about 60 degrees Celsius (° C.) to about 150° C., and ranges therebetween. Durations for the vacuum annealing range, for example, from about 1 minute to about 24 hours, and ranges therebetween.

In its simplest form, the methylammonium halide vapor source can be a methylammonium halide powder which is placed in a container or vessel (such as a dish) proximal to the sample (e.g., the metal halide film-coated substrate—see step 102 above). During the vacuum annealing the powder will vaporize forming a vapor within the reaction chamber. This type of vapor source configuration is suitable for reactions over small area substrates.

However, when perovskite formation over large area substrates (e.g., 1 square meter or larger), is desired, a source substrate coated with methylammonium halide is employed according to an exemplary embodiment of the present techniques. This technique serves to insure even formation and coverage of the perovskite material on the substrate. Specifically, by way of example only, this process involves coating a source substrate (e.g., a glass plate, flat quartz reactor, etc.) with an excess amount of methylammonium halide. The methylammonium halide can be coated on the source substrate using any suitable solution deposition process (including but not limited to, spin-coating, spray-coating, and drop-casting) or vapor deposition process. The term "excess" is used here to imply that the source substrate is coated with a greater amount of the methylammonium halide than is needed to form the perovskite material on a given sample. Thus, if so desired, the same source substrate can be used for processing multiple samples. It is of course possible to coat the source substrate with the exact amount of methylammonium halide for processing a single sample. However, as described below, care must be taken to control the temperature of the source substrate vis-à-vis the sample to prevent condensation of the methylammonium halide on the sample.

The source substrate coated with methylammonium halide is preferably placed in close proximity to, but not physically touching, the sample substrate. By way of example only, the source substrate with methylammonium halide (e.g., methylammonium iodide, methylammonium bromide, or methylammonium chloride) is placed a distance of from about 0.2 millimeters (mm) to about 20 mm, and ranges therebetween, away from the metal halide film surface of the sample.

Optionally, in step 106, the process is monitored in real-time to observe the reaction, since the optical properties of the sample change as the reaction progresses from metal halide to perovskite. This optional step permits optimization of the process parameters including the duration for which the vacuum annealing step is performed. An exemplary apparatus for real-time monitoring of the reaction is provided in FIG. 2 or FIG. 3, described below.

Any number of reactor designs is suitable for the present process as long as the design permits i) a vacuum to be drawn (i.e., a reduced pressure) during the annealing, ii) elevated temperatures, and iii) being able to situate the methylammonium vapor source proximal to the metal halide surface of the sample. By way of example only a simple reactor design includes a flat quartz reactor, such as those commercially available from Hellma Analytics, Mullheim, Germany. The methylammonium halide can be deposited onto the inner surfaces of the flat quartz reactor. The samples can be placed in the reactor and the reactor sealed with a rubber strip. Such quartz reactors can be equipped to connect to a vacuum pump for creating the required reduced pressure within the vessel. More advanced designs which permit real-time reaction monitoring and improved treatment uniformity are shown in FIG. 2 and FIG. 3.

Figure 2:
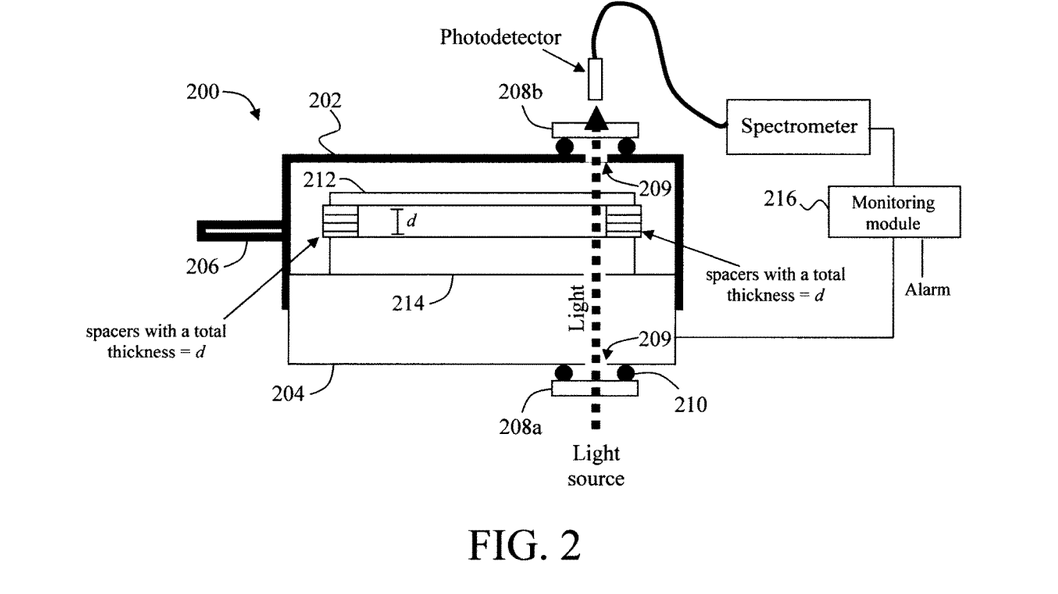
FIG. 2 is a schematic diagram illustrating an exemplary reaction and monitoring apparatus that permits real-time monitoring of the present process for forming a perovskite material using transmission optical measurements through a sample according to an embodiment of the present invention.
Figure 3:
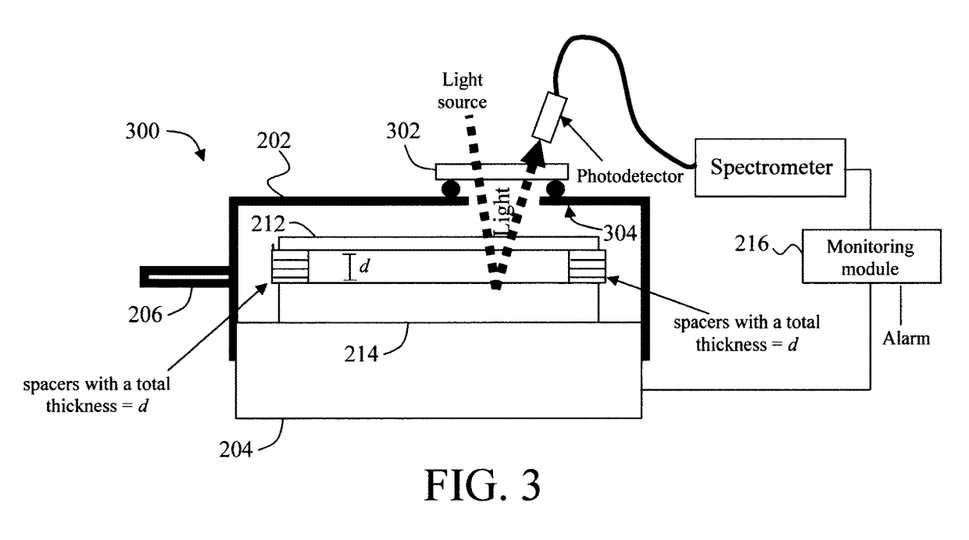
FIG. 3 is a schematic diagram illustrating an exemplary reaction and monitoring apparatus that permits real-time monitoring of the present process for forming a perovskite material using reflective optical measurements for non-optically transparent samples according to an embodiment of the present invention.

Specifically, FIG. 2 is a diagram illustrating an exemplary apparatus 200 that combines the above-described reactor vessel design specifications along with the ability to monitor the reaction in real time. Apparatus 200 may be used to implement the steps of methodology 100 (of FIG. 1).

As shown in FIG. 2, the reaction and monitoring apparatus 200 includes a gas-tight enclosure 202 sealed to a temperature-controlled hot plate 204. Sealing the enclosure 202 to the hot plate 204 permits a vacuum to be drawn in the enclosure. An evacuation tube 206 in the enclosure can be connected to a vacuum pump (not shown) to draw a vacuum and thereby create a reduced pressure environment within the enclosure. The gas-tight enclosure forming a vacuum chamber and the temperature-controlled hot plate enable annealing under a vacuum as per step 104 of methodology 100 (of FIG. 1).

Apparatus 200 further includes transparent windows 208a and 208b affixed to the enclosure in line of sight of one another, such that light from a light source can pass through the enclosure 202 (and through a particular sample 214 within the enclosure 202) and be picked up by a photodetector. In the exemplary embodiment shown in FIG. 2, the photodetector is a component of a spectrometer.

As is known in the art, a spectrometer can be used to analyze the optical properties of a sample. In this particular implementation, use of a spectrometer permits a user to monitor the perovskite formation reaction in real-time. Specifically, as the above-described reaction between the metal halide film and the methylammonium halide vapor progresses, the color of the sample changes indicating transition from metal halide to perovskite. This color change affects the optical properties of the sample. Thus when transmission measurements (i.e., wherein light is passed through the sample) are made using the spectrometer, the absorption spectrum of the sample changes, and can be monitored by the user and/or in an automated manner (e.g., against a known endpoint) in order to detect the endpoint of full conversion to perovskite material with the desired optical properties. By way of example only, the absorption characteristics of the sample can be compared with those of the correct end product perovskite material, and the reaction can be allowed to run until the sample matches the end-point standard. This monitoring can be done by the user. However, to automate the monitoring system, a monitoring module 216 can be included to process the spectrometer measurements from the sample and compare them with the end-point standard. When the optical data from the sample matches the correct end product perovskite material, then the monitoring module can stop the reaction, e.g., by turning off the hot plate 204. Thus, in this case the monitoring module 216 is adapted to receive data from the spectrometer and to control the hot plate 204. See FIG. 2. Alternatively, the monitoring system can alert the user by way of an alarm or other similar indicator that the reaction is completed so that the user can turn off the hot plate and remove the sample. See FIG. 2. By way of example only, the monitoring module may be embodied in a computer apparatus, such as apparatus 600 of FIG. 6—described below.

Having such real-time monitoring capabilities is advantageous because minimizing the duration of the process (i.e., by not running the reaction longer than necessary to retrieve the desired end product) could reduce the thermal damage to other sensitive solar cell elements, as well as increase throughput and minimize energy consumption. Further, it is disadvantageous to stop the reaction too soon, as may be the case when the guideline annealing times are being used rather than real-time monitoring. Specifically, the reaction precursors, i.e., the metal halide, methylammonium halide, etc. are not photovoltaic. Thus, end-pointing the reaction too soon, before perovskite formation, would yield a material that is not photovoltaic.

One requirement of the enclosure 202 is that it permits a vacuum to be drawn. Thus as shown in FIG. 2, the transparent windows 208a and 208b (e.g., quartz or sapphire glass windows) are sealed to the outside of enclosure 202 using a gasket 210 (or any other suitable means for gas-tight sealing a transparent window to the housing). As shown in FIG. 2, a path for the light generated by the light source is provided via openings 209 in the enclosure 202 and the hot plate 204. These openings 209 are sealed by the transparent windows 208a and 208b. According to an exemplary embodiment, the hot plate is a formed from a block of metal (e.g., a copper block) formed having a resistive heating element (not shown) coiled within the block. Thus a hole can be drilled in the block in order to provide an opening in the hot plate 204 (to provide the light path) as long as the hole is made in a location of the block that does not interfere with the resistive heating element.

In the exemplary embodiment illustrated in FIG. 2 the source of the methylammonium halide for the reaction is a source substrate 212 coated with (preferably excess—see above) methylammonium halide. Based on the particular parameters for a given implementation of the present techniques (e.g., the vapor pressure of the methyl ammonium halide during the process (e.g., at the set temperature), the volume of the chamber, the starting film thickness, and the density), one skilled in the art would be able to quantify, a priori, an amount of methylammonium halide one expects to lose for a given anneal duration, and from that the change in methylammonium halide film thickness expected. So by way of example only, if one expects to lose X nm of the methylammonium halide film thickness during the anneal, then a starting film thickness that is greater than X would constitute an excess amount of methylammonium halide.

According to an exemplary embodiment, the methylammonium halide is coated on the substrate using a solution or vapor deposition process to form a solid film on the (source) substrate. The source substrate 212 is located in close proximity to, but not physically touching a sample 214 (which is sitting on the hot plate 204). According to an exemplary embodiment, the source substrate 212 and the sample 214 are separated by a distance d of from about 0.2 mm to about 20 mm, and ranges therebetween. By way of example only, in the example shown illustrated in FIG. 2, one or more spacers (e.g., glass plates) are used to separate the source substrate the correct distance d from the sample. Specifically, the sample is placed face up on the hot plate (i.e., with the metal halide surface facing up), the spacers are positioned on the sample, and the source substrate is placed face down on the spacers (i.e., with the surface of the source substrate coated with the methylammonium halide facing down). However, any suitable configuration for correctly positioning the source substrate relative to the sample may be employed.

Further, as per step 102 of methodology 100 (of FIG. 1), the sample may include a substrate coated with a metal halide layer. In that case, it is preferable that the sample 214 is placed on the hot plate 204 with the substrate on the hot plate and the metal halide layer facing a surface of the source substrate coated with methylammonium halide. Thus, if one side of the sample substrate is coated with the metal halide layer, and one side of the source substrate is coated with the methylammonium halide, then these coated sides of the respective substrates are positioned facing one another in the enclosure.

Further, it is preferable that, during operation, the temperature of the source substrate is not higher than the temperature of the sample so that no excess methylammonium halide will condense on the sample requiring further removal (i.e., the temperature of the sample should be greater than (or equal to) the temperature of the source substrate). By implementing the configuration illustrated in FIG. 2 and described herein, this qualification is met since the sample substrate is placed on the hot plate and the source substrate is spaced a distance away from the sample substrate, and the hot plate serves to heat both the sample and the source substrates.

As further shown in FIG. 2, the path of the light from the light source to the photodetector is perpendicular to the sample. As the reaction progresses from metal halide to perovskite, the spectrometer is used to monitor changes in the absorbance spectrum as per step 106 of methodology 100 (of FIG. 1).

Use of the reaction and monitoring apparatus 200 assumes that the sample substrate is transparent, thus permitting such transmission optical readings to be taken through the sample. However, not all device configurations employ a transparent substrate. In the case where a non-transparent substrate is used, it is still possible to monitor the reaction via reflective measurements as long as the sample substrate is formed from a light reflective material such as silver or aluminum and can act as a mirror to reflect incident light back to a detector. Thus, an alternative reaction and monitoring apparatus 300 is provided in FIG. 3, which permits the real-time monitoring of samples having non-transparent substrates via reflective measurements. Apparatus 300 may also be used to implement the steps of methodology 100 (of FIG. 1).

A majority of the components in reaction and monitoring apparatus 300 are the same as that in apparatus 200 and thus will be numbered alike in FIG. 3. Reference can thus be made to the above description relating to these overlapping components. Specifically, the main difference from apparatus 200 is in the placement of the light source and the photodetector, and the configuration of the enclosure 202 to permit reflective (rather than transmission) readings to be taken by the spectrometer.

In this exemplary embodiment, only one transparent window 302 and one opening 304 in the enclosure 202 (no pathway is needed through the hot plate 204) is needed. Transparent window 302 may be formed from the same material as the transparent windows 208a and 208b in apparatus 200, but however might be slightly larger to permit a path for the reflected light from the light source to the detector. Specifically, as shown in FIG. 3, light from the light source incident on the sample is reflected back off of the (non-transparent) sample substrate and picked up by the spectrometer photodetector. Reaction and monitoring apparatus 300 provides the same vacuum annealing and optional automated monitoring capabilities as apparatus 200, described above.

It is notable that while reaction and monitoring apparatus 200 and reaction and monitoring apparatus 300 are shown as discrete systems in FIGS. 2 and 3, respectively, having two separate, distinct systems is not required. Namely, while one system can be dedicated for transmission optical monitoring and another for reflective optical monitoring, the same system may be reconfigurable to perform both functions. For instance, simply changing the position of the light source and the photodetector can adapt reaction and monitoring apparatus 200 to perform reflective readings, and vice-versa. Thus, regardless of the system, the hot plate may be configured having a hole therein (as described above) as a light path, which gets covered up when a non-transparent sample is placed on the hot plate.

In one exemplary implementation, the present techniques are employed to form a perovskite-based photovoltaic device. In that regard, an exemplary process for forming a perovskite-based photovoltaic cell is now described by way of reference to methodology 400 of FIG. 4. By way of example only, methodology 400 will be described as being carried out in the reaction and monitoring apparatus 200 of FIG. 2 or in the reaction and monitoring apparatus 300 of FIG. 3 (both described above). However, methodology 400 may be carried out in any vessel in which annealing under a vacuum can be implemented.

In step 402, the process begins with an electrically conductive substrate on which the device will be built. Optionally, the substrate is a transparent substrate. As provided above, use of a transparent substrate can permit real-time monitoring of the reaction via the reaction and monitoring apparatus 200 (of FIG. 2). However, while such transmission optical readings (i.e., through the substrate) are not possible with a non-transparent substrate, reflective readings can be obtained using reaction and monitoring apparatus 300, described above, as long as the sample substrate is formed of a material (such as silver or aluminum) that is reflective to light.

Suitable transparent substrates include, but are not limited to, glass, quartz, or sapphire substrates. When the substrate is formed from a material such as glass, quartz or sapphire all of which are not electrically conductive, the substrate may optionally be coated with a layer of a first electrically conductive material. According to an exemplary embodiment, the first electrically conductive material is indium-tin-oxide (ITO). As will be described in detail below, compared to ITO a low work function material for the second electrode can be, for example, a metal such as aluminum (Al) or magnesium (Mg). ITO can be deposited onto the substrate using a physical vapor deposition process such as e-beam evaporation or sputtering.

Optionally, in step 404, a layer of first (carrier selective) hole transporting or electron transporting material is coated on the substrate (e.g., on a side of the first electrically conductive material (if present) opposite the substrate). Suitable hole transporting materials include, but are not limited to, poly(3,4-ethylenedioxythiophene)-poly(styrenesulfonate) (PEDOT:PSS) or molybdenum trioxide ($MoO_3$). Suitable electron transporting materials include, but are not limited to, phenyl-C61-butyric acid methyl ester (PCBM), C60, and bathocuproine (BCP). By way of example only, the (carrier selective) hole transporting or electron transporting material can be deposited from a solution onto the substrate using a spin-coating process. While use of the first hole transporting or electron transporting material and/or the second hole transporting or electron transporting is optional since a working device can be made without them, both selective carrier layers are needed for the highest efficiency solar cells.

In step 406, the substrate (the substrate itself, or the first electrically conductive material if present on the substrate) or the optional first hole transporting or electron transporting material if present on the substrate is then coated with a metal halide layer. As described in conjunction with the description of methodology 100 of FIG. 1, above, according to the present process suitable metal halides include those having the formula $MX_2$, wherein M is Pb and/or Sn, and X is at least one of F, Cl, Br, and I. By way of example only, a solution of the metal halide may be deposited onto the substrate (or onto the optional first hole transporting or electron transporting material if present on the substrate) using a solution or vapor deposition process.

In step 408, the substrate is then placed in a sealed chamber for vacuum annealing. According to an exemplary embodiment, reaction and monitoring apparatus 200 (of FIG. 2) or reaction and monitoring apparatus 300 (of FIG. 3) is used as the vessel for the reaction. As described in detail above, apparatus 200 permits real-time monitoring of the reaction using transmission optical readings through the sample. Thus when an optically transparent starting substrate is employed (see above), then reaction and monitoring apparatus 200 is ideal for carrying out the reaction. Alternatively, when the starting substrate is not optically transparent, then reaction and monitoring apparatus 300 would be better suited since it permits reflective optical measurements to be made. In either case, the substrate is the sample 214 (see FIGS. 2 and 3). Specifically, by way of example only, the enclosure 202 is separated from the hot plate 204, and the substrate is placed on the hot plate 204 with the metal halide layer surface facing up.

In step 410, a methylammonium halide source is placed in the vacuum chamber in close proximity to the substrate. In the case of the present reaction and monitoring apparatus 200 or reaction and monitoring apparatus 300, the methylammonium halide source is present on a source substrate 212 (e.g., a glass plate) which is coated with (preferably excess amounts of) the methylammonium halide (e.g., methylammonium iodide, methylammonium bromide, or methylammonium chloride) by a solution or vapor deposition technique. The source substrate is located in the chamber in close proximity to, but not physically touching the substrate/sample (e.g., the source substrate and the sample are separated by a distance d of from about 0.2 mm to about 20 mm, and ranges therebetween—see FIGS. 2 and 3). As provided above, it is also possible to use a methylammonium halide (such as a methylammonium halide powder) which is placed in a container or vessel (such as a dish) proximal to the sample to create the methylammonium halide vapor source.

Next, the vacuum chamber is sealed and in step 412 the sample is vacuum annealed in the presence of the methylammonium halide (e.g., methylammonium iodide, methylammonium bromide, or methylammonium chloride) under conditions (e.g., temperature, duration, pressure, etc.) sufficient to form methylammonium halide vapor (by evaporating the methylammonium halide) which reacts with the metal halide layer to form a perovskite material. With either apparatus 200 or apparatus 300, this step involves sealing the enclosure 202 to the hot plate 204. By way of example only, the enclosure 202 may be fitted over the top of the hot plate 204 as shown in FIGS. 2 and 3, and a rubber seal (not shown) may be fitted over the juncture of the enclosure and the hot plate to form a gas-tight seal.

A vacuum is then drawn in the sealed enclosure 202 by attaching a vacuum pump to the evacuation tube 206. As described above, a vacuum of less than about 50 Torr, e.g., from about $1 \times 10^{-6}$ millitor to about 50 Torr, and ranges therebetween, may be employed. The hot plate 204 is then used to heat the sample. As described above, the present reaction may be carried out a temperature of from about 60° C. to about 150° C., and ranges therebetween.

While an exemplary duration of the reaction was provided above (e.g., from about 1 minute to about 24 hours, and ranges therebetween) an advantage of using apparatus 200 or apparatus 300 is that it permits real-time monitoring of the reaction based on the changing optical properties of the sample. Specifically, as the reaction progresses from metal halide to perovskite, the absorbance spectrum of the sample changes. As described above, the apparatus includes a light source, a photodetector, and a spectrometer for measuring the optical properties of the sample. Thus, according to an exemplary embodiment, in step 414 the optical properties of the sample are monitored in real-time (at the same time that the vacuum annealing is being carried out) as the reaction progresses. This will indicate when an optimal perovskite sample has been obtained.

Once the perovskite material layer has been formed, the sample is removed from the vacuum chamber. In step 416, an optional second (carrier selective) hole transporting or electron transporting material or combination of materials (of an opposite polarity to the first hole transporting or electron transporting material respectively) is deposited onto the perovskite layer. For instance, in the case of a first (carrier selective) material being a hole transporting material such as but not limited to PEDOT:PSS or $MoO_3$ (see above), the second (carrier selective) material chosen might be an electron transporting such as phenyl-C61-butyric acid methyl ester (PCBM), C60, or BCP.

Finally, in step 418, an electrically conductive material is deposited onto the perovskite (or onto the optional second hole transporting or electron transporting material if present). In the instance where a first electrically conductive material was deposited onto the substrate (see description of step 402, above), the electrically conductive material deposited on the perovskite (or on the optional second hole transporting or electron transporting material coated perovskite) is referred to herein as a second electrically conductive material. The second electrically conductive material will serve as (the second) one of the two electrodes and can be optionally transparent. For solar cell applications at least one of the electrically conductive materials has to be partially transparent in the solar spectrum. ITO is provided above as an exemplary first electrically conductive material and is optically transparent which meets this requirement. As provided above, compared to the first electrically conductive material (e.g., ITO), the second electrically conductive material is preferably formed from a lower work function material such as Al or Mg. The second electrically conductive material can be deposited onto the perovskite (or optional second carrier selective material) using a physical vapor deposition process such as e-beam evaporation or sputtering.

Figure 4:
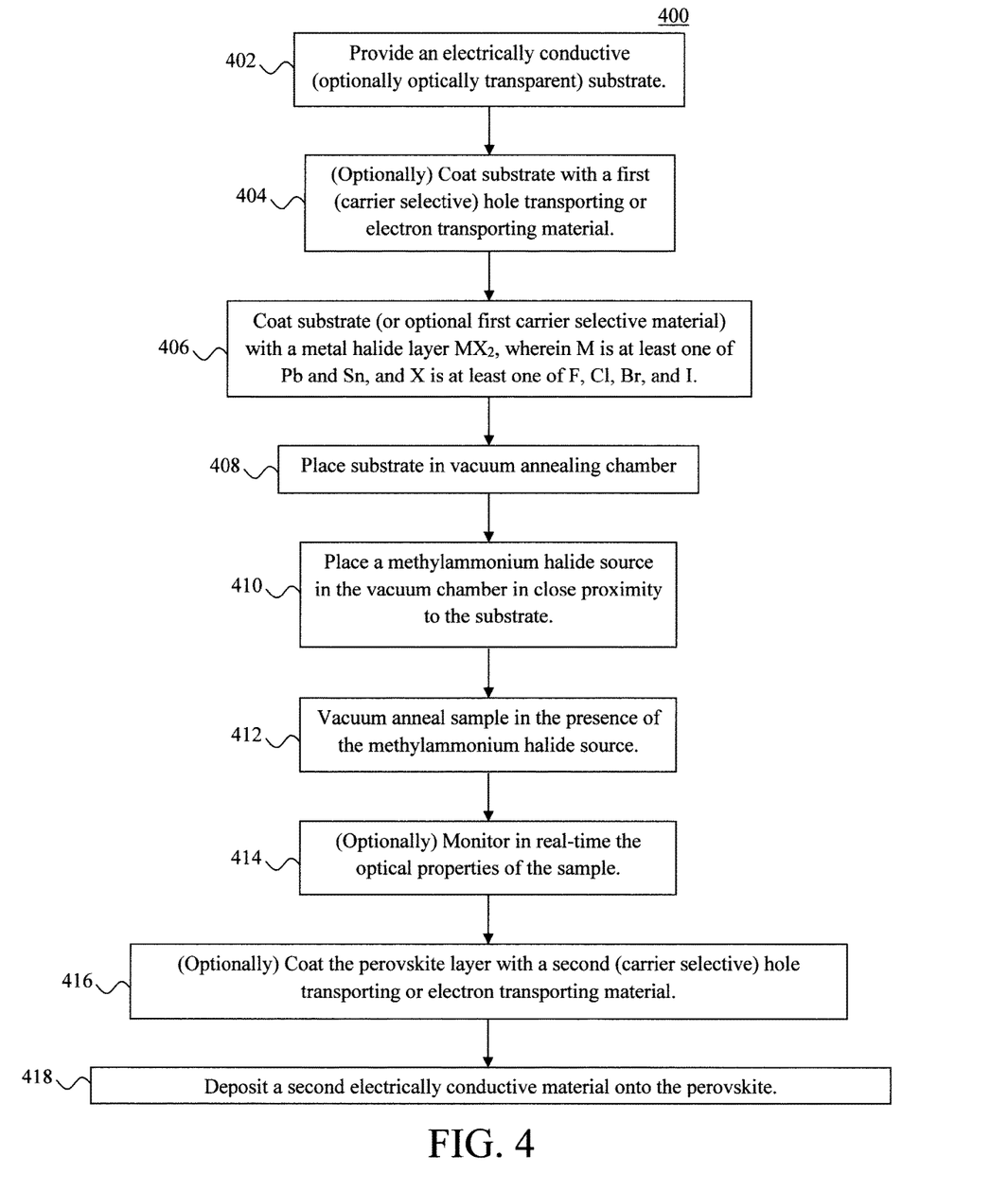
FIG. 4 is a diagram illustrating an exemplary methodology for forming a perovskite-based photovoltaic cell according to an embodiment of the present invention.
Figure 5:
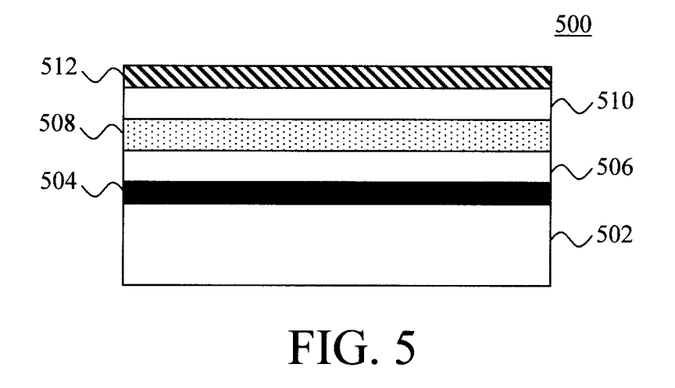
FIG. 5 is a diagram illustrating an exemplary perovskite-based photovoltaic cell formed, for example, according to the methodology of FIG. 4 according to an embodiment of the present invention.

FIG. 5 is a diagram illustrating an exemplary perovskite-based photovoltaic cell 500 formed, for example, according to methodology 400 of FIG. 4. As shown in FIG. 5, the perovskite-based photovoltaic cell 500 includes a substrate 502, an (optional) first electrically conductive material 504 on the substrate 502, an (optional) first (carrier selective) hole transporting or electron transporting material 506 on a side of the first electrically conductive material 504 opposite the substrate 502, a perovskite material 508 on a side of the first hole transporting or electron transporting material 506 opposite the first electrically conductive material 504, an (optional) second (carrier selective) hole transporting or electron transporting material 510 on a side of the perovskite material 508 opposite the first hole transporting or electron transporting material 506, and a second electrically conductive material 512 on a side of the second hole transporting or electron transporting material 510 opposite the perovskite material 508.

As provided above, the substrate 502 is electrically conductive and optionally optically transparent. Suitable transparent substrate materials include, but are not limited to glass, quartz, or sapphire substrates. When the substrate is formed from a material such as glass, quartz or sapphire all of which are not electrically conductive, the substrate may optionally be coated with a layer of the first electrically conductive material 504. According to an exemplary embodiment, the first electrically conductive material 504 is ITO.

The optional first (carrier selective) material 506 is either a hole transporting or electron transporting material. When the second (also optional) (carrier selective) material 510 is present, the first hole transporting or electron transporting material 506 and the second hole transporting or electron transporting material 510 have opposite polarities from one another, i.e., where one is a hole transporting material and the other is an electron transporting material, or vice-versa. See above. According to an exemplary embodiment, the first carrier selective material 506 is formed from a hole transporting material such as PEDOT:PSS or $MoO_3$ and the second carrier selective material 510 is an electron transporting material such as PCBM, C60, and/or BCP.

Finally, the second electrically conductive material 512 can be optionally transparent. However, as provided above, for solar cell applications at least one of the conductive materials has to be partially transparent in the solar spectrum. ITO, an exemplary first conductive material, is optically transparent which meets this requirement. Compared to the first electrically conductive material 504, the second electrically conductive material 512 is preferably formed from a lower work function material such as Al or Mg.

Figure 6:
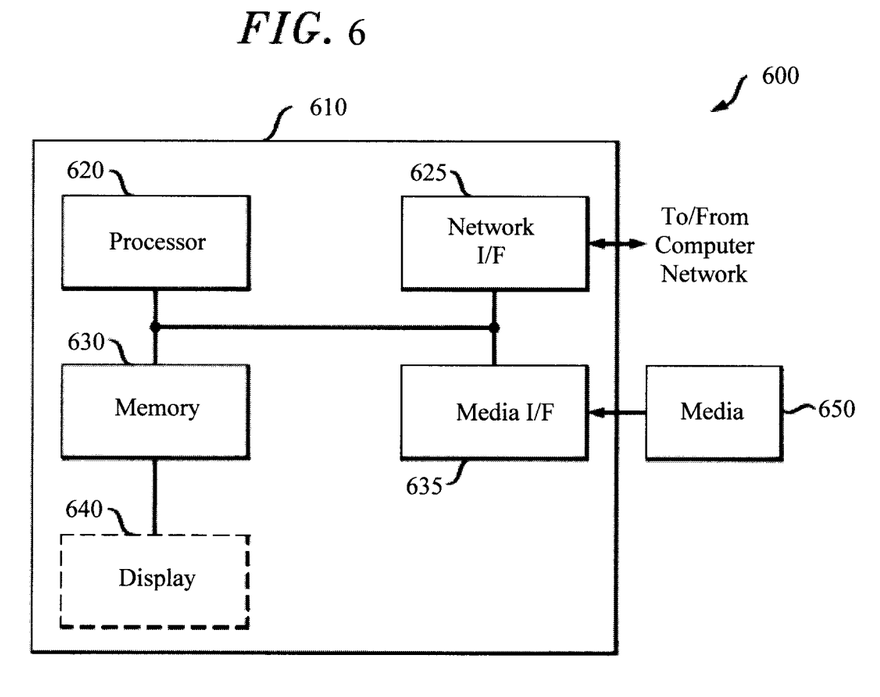
FIG. 6 is a diagram illustrating an exemplary computer apparatus according to an embodiment of the present invention.

FIG. 6 is a block diagram of an apparatus 600 which may be implemented as the monitoring module 216 in reaction and monitoring apparatus 200 (FIG. 2) and/or in reaction and monitoring apparatus 300 (FIG. 3). Apparatus 600 includes a computer system 610 and removable media 650. Computer system 610 includes a processor device 620, a network interface 625, a memory 630, a media interface 635 and an optional display 640. Network interface 625 allows computer system 610 to connect to a network, while media interface 635 allows computer system 610 to interact with media, such as a hard drive or removable media 650.

Processor device 620 can be configured to implement the methods, steps, and functions disclosed herein. The memory 630 could be distributed or local and the processor device 620 could be distributed or singular. The memory 630 could be implemented as an electrical, magnetic or optical memory, or any combination of these or other types of storage devices. Moreover, the term "memory" should be construed broadly enough to encompass any information able to be read from, or written to, an address in the addressable space accessed by processor device 620. With this definition, information on a network, accessible through network interface 625, is still within memory 630 because the processor device 620 can retrieve the information from the network. It should be noted that each distributed processor that makes up processor device 620 generally contains its own addressable memory space. It should also be noted that some or all of computer system 610 can be incorporated into an application-specific or general-use integrated circuit.

Optional display 640 is any type of display suitable for interacting with a human user of apparatus 600. Generally, display 640 is a computer monitor or other similar display.

Figure 7:
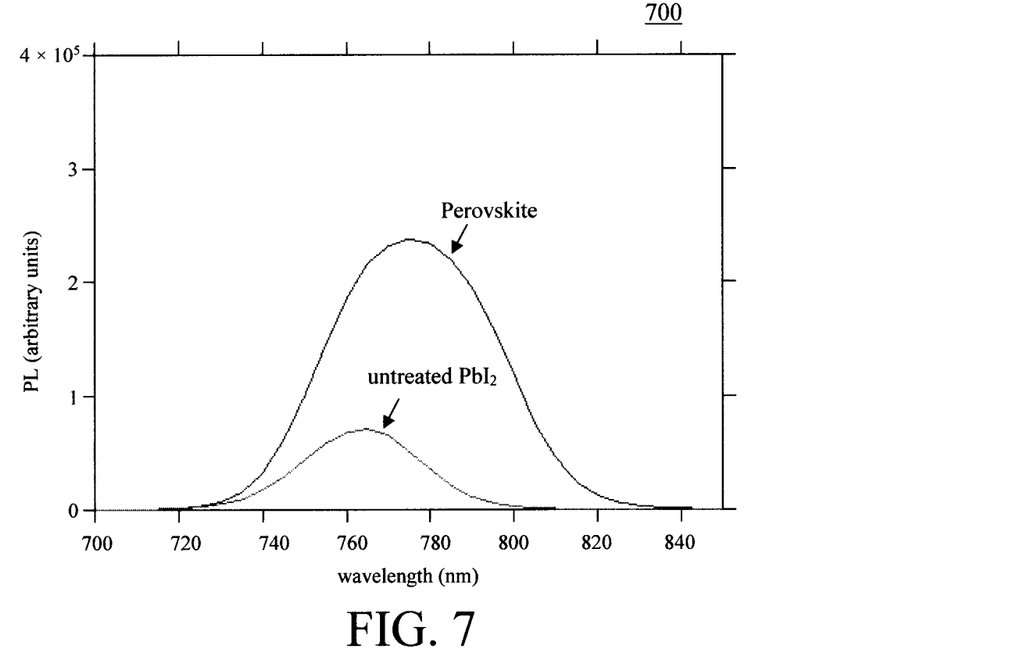
FIG. 7 is a photoluminescence spectrum of a perovskite sample prepared using the present techniques according to an embodiment of the present invention.
Figure 8:
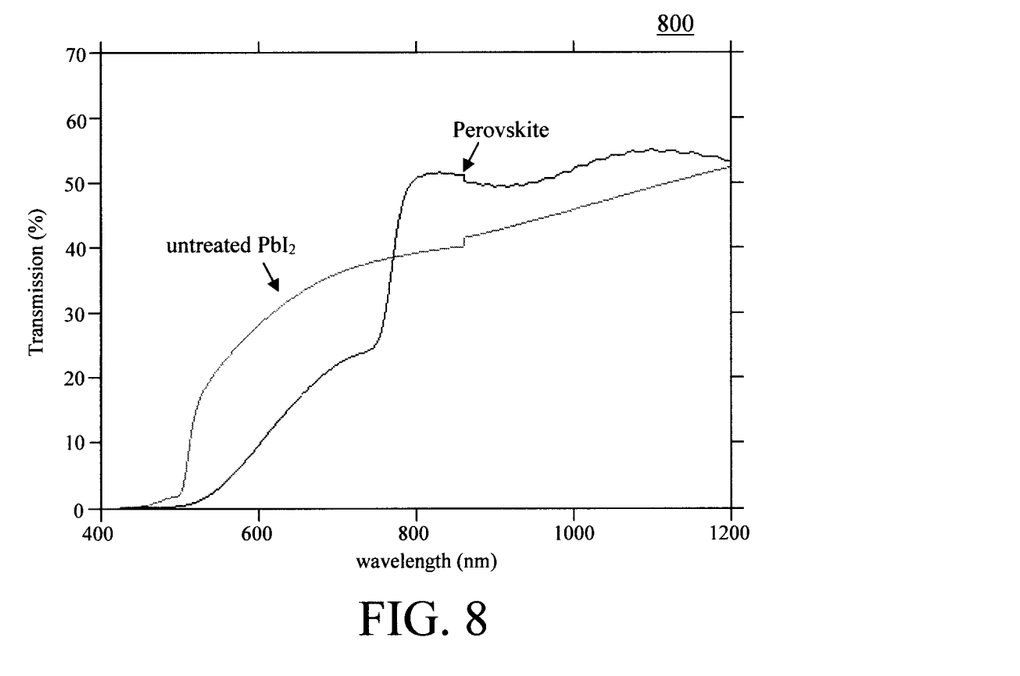
FIG. 8 is a transmission spectrum of a perovskite sample prepared using the present techniques according to an embodiment of the present invention.

The present techniques are further described by way of reference to the following non-limiting examples:

Example 1 (Pb-based absorbers): $PbI_2$ layers were prepared by spin coating 0.8 molar (M) $PbI_2$ in Dimethylformamide (DMF) at different spin speeds (i.e., 2,000 and 5,000 revolutions per minute (rpm)). Conversely, the lead iodide film could have been coated onto a substrate by a vapor deposition process instead of spin-coating. Two 2 inch×2 inch samples were placed in a flat quartz reactor coated with excess $CH_3NH_3I$ by casting 2 milliliters (ml) of 2 percent (%) $CH_3NH_3I$ solution in isopropanol followed by drying at 100° C. for 5 minutes that was sealed with a rubber strip and connected to a vacuum pump. The assembly was positioned for 90 minutes on a hot plate set at 150° C. Color change from yellow to homogeneous dark brown was observed beginning in 20-30 minutes, indicating transition from $PbI_2$ to perovskite, which was confirmed by X-ray diffraction (XRD), ultraviolet-visible spectrophotometry (UV-Vis) and photoluminescence (PL) measurements. FIG. 7 is a photoluminescence spectrum 700 of the perovskite sample from example 1 and an untreated $PbI_2$ sample. In FIG. 7 wavelength (measured in nanometers (nm)) is plotted on the x-axis and photoluminescence (PL) (measured in arbitrary units) is plotted on the y-axis. FIG. 8 is a transmission spectrum 800 of the perovskite sample from example 1 and an untreated $PbI_2$ sample. In FIG. 8 wavelength (measured in nanometers (nm)) is plotted on the x-axis and percent (%) transmission is plotted on the y-axis.

Figure 9:
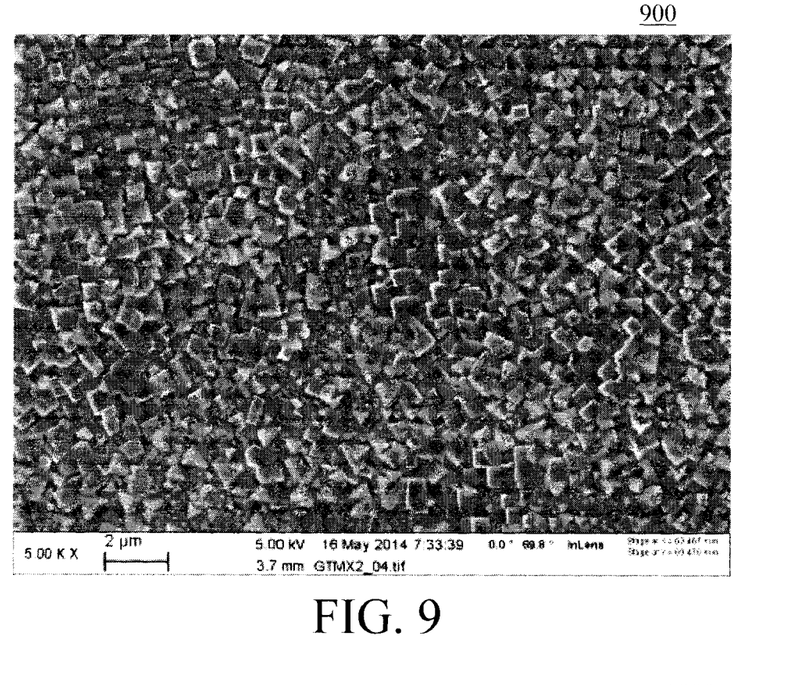
FIG. 9 is an image of a lead-free (tin-based) perovskite sample prepared using the present techniques according to an embodiment of the present invention.

Example 2 (Sn-based absorbers): $SnI_2$ layers were prepared by spin coating 0.8M $SnI_2$ in DMF at different spin speeds (2,000 and 5,000 rpm). Conversely, the tin iodide film could have been coated onto a substrate by a vapor deposition process instead of spin-coating. Two 2 inch×1 inch samples, together with one comparison sample of $PbI_2$ according to Example 1 were placed in a flat quartz reactor coated with excess $CH_3NH_3I$ by casting 2 ml of 2% $CH_3NH_3I$ solution in isopropanol followed by drying at 100° C. for 5 minutes that was sealed with a rubber strip and connected to a vacuum pump. The assembly was positioned for 5 hours on a hot plate set at 120° C. Color change from yellow to black was observed in the Sn-based sample starting and ending sooner than the Pb-based samples. XRD indicated presence of Sn-perovskite phase. FIG. 9 is an image 900 of a lead-free (Sn-based) sample prepared according to example 2.

Example 3 (Solar cell): ITO-coated glass substrates were spin-coated at 3,000 rpm with PEDOT:PSS (Aldrich) and annealed at 140° C. for 15 min. 0.67M $PbI_2$ in DMF was spin coated on top at 2,000 rpm. The substrate size during coating and vacuum anneal to form the perovskite layer was 25 $cm^2$. For test solar cell fabrication it was later cut into 2.5 cm×2.5 cm pieces. The samples were placed in the annealing apparatus object of the present disclosure and annealed at 80° C. for 14 hours in the presence of close-spaced (d=1 mm) glass plate coated with excess $CH_3NH_3I$ by casting 2 ml of 2% $CH_3NH_3I$ solution in isopropanol followed by drying at 100° C. for 5 minutes. On the obtained perovskite layer 2% PCBM was coated at 1,000 rpm followed by evaporated aluminum contacts. A solar cell efficiency was measured at approximate 1 sun conditions using a halogen lamp and a Newport-calibrated crystalline silicon cell as a reference instead of standard simulated 1 sun AM1.5G illumination. Device parameters were: Eff=12.25%, FF=76%, Voc=952 mV, Jsc=16.8 mA/cm2.

Figure 10:
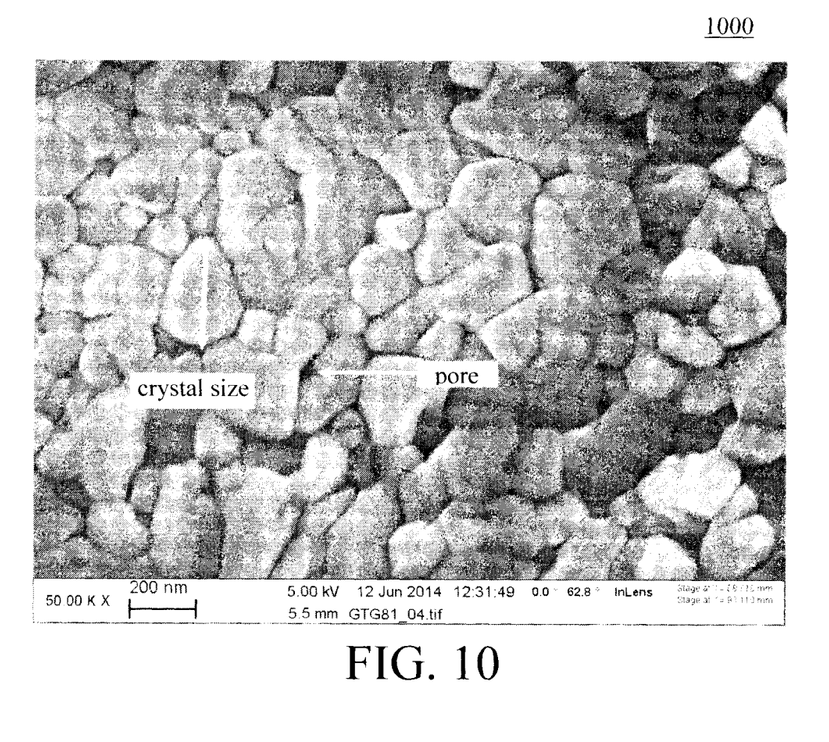
FIG. 10 is an image of a surface of a perovskite film sample prepared according to the present techniques according to an embodiment of the present invention.
Figure 11:
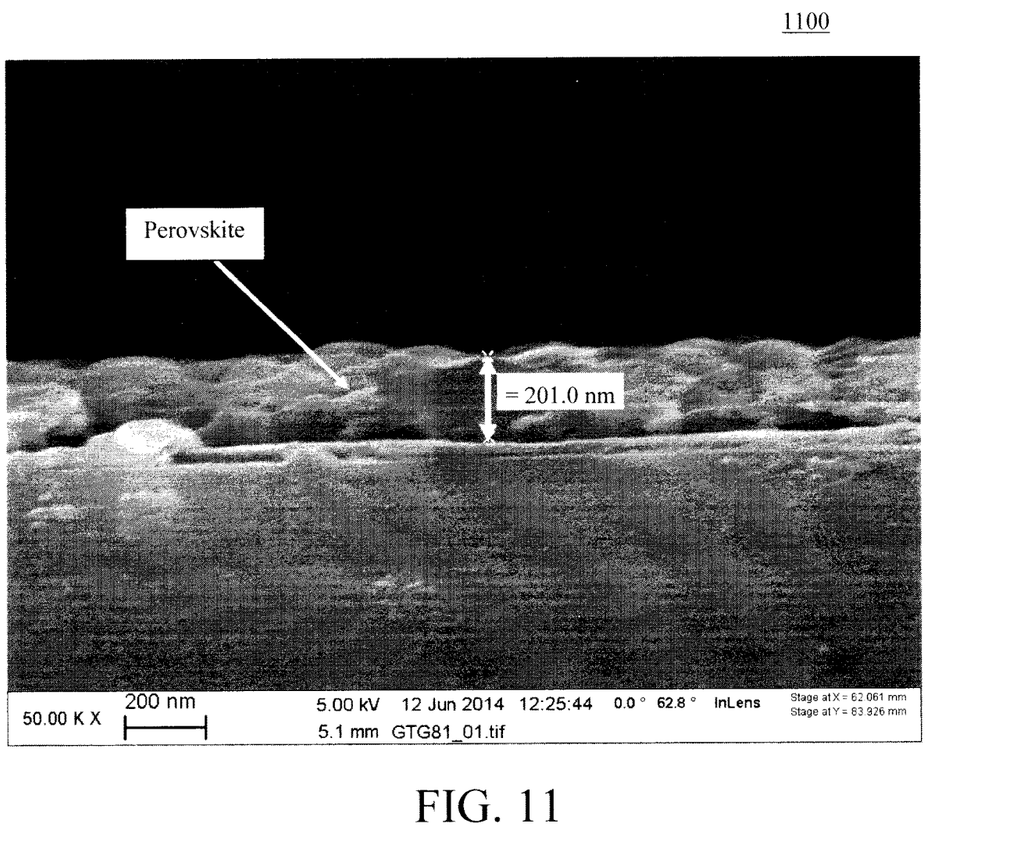
FIG. 11 is an image of a cross-section of the perovskite film sample of FIG. 10 according to an embodiment of the present invention.

FIG. 10 is an image 1000 of a surface and FIG. 11 is an image 1100 of a cross-section of a perovskite film sample on glass/ITO/PEDOT prepared according to Example 3 (before solar cell completion). The advantages of perovskite preparation using the present techniques can be readily seen from these top-down and cross-sectional images of the sample. Specifically, use of the present techniques can be used to form large area (e.g., greater than 20 $cm^2$) perovskite films that are uniform (e.g., in term microstructure and optical properties), thick (see, e.g., image 1100 wherein film thickness T is from about 20 nanometers (nm) to about 300 nm, and ranges therebetween, e.g., from about 100 nm to about 300 nm, and ranges therebetween), dense (e.g., porosity is less than 5% of the film volume—see image 100), high quality (e.g., the cracks or defects penetrating the perovskite layer are less than 1% of the film surface), and have large crystal size (e.g., an average crystal size is greater than 0.5T). Crystal size may be measured as a longest dimension of each crystal in cross section (see image 1000) and an average taken.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A perovskite-based photovoltaic device, comprising:
   a first electrically conductive material on a substrate;
   a first hole transporting or electron transporting material on the first electrically conductive material;
   a perovskite material formed on the first hole transporting or electron transporting material by depositing a metal halide layer on the first hole transporting or electron transporting material, and vacuum annealing the metal halide layer and methylammonium halide under conditions sufficient to form methylammonium halide vapor which reacts with the metal halide layer and forms a sample comprising the perovskite material on the first hole transporting or electron transporting material, wherein the perovskite material has a thickness T of from about 20 nanometers to about 300 nanometers, and ranges therebetween, and an average grain size that is greater than 0.5T;
   a second hole transporting or electron transporting material on the perovskite material which has an opposite polarity from the first hole transporting or electron transporting material; and
   a second electrically conductive material on the second hole transporting or electron transporting material.

2. The perovskite-based photovoltaic device of claim 1, wherein the substrate is a transparent substrate.

3. The perovskite-based photovoltaic device of claim 2, wherein the substrate is selected from the group consisting of: a glass substrate, a quartz substrate and a sapphire substrate.

4. The perovskite-based photovoltaic device of claim 1, wherein the first electrically conductive material comprises indium-tin-oxide (ITO).

5. The perovskite-based photovoltaic device of claim 1, wherein the first hole transporting or electron transporting material is selected from the group consisting of: poly(3,4-ethylenedioxythiophene)-poly(styrenesulfonate) (PEDOT:PSS) and molybdenum trioxide ($MoO_3$).

6. The perovskite-based photovoltaic device of claim 1, wherein the second hole transporting or electron transporting material is selected from the group consisting of: phenyl-C61-butyric acid methyl ester (PCBM), C60, and bathocuproine (BCP).

7. The perovskite-based photovoltaic device of claim 1, wherein the second electrically conductive material comprises a material selected from the group consisting of: aluminum (Al) and magnesium (Mg).

8. The perovskite-based photovoltaic device of claim 1, wherein the perovskite material has a thickness T of from about 100 nanometers to about 300 nanometers, and ranges therebetween.

9. The perovskite-based photovoltaic device of claim 1, wherein, as reaction of the methylammonium halide and the metal halide layer progresses, a color of the sample changes indicating a transition from metal halide to the perovskite material, and wherein changes in the color affect optical properties of the sample.

10. The perovskite-based photovoltaic device of claim 9, wherein the perovskite material is formed on the first hole transporting or electron transporting material further by monitoring in real-time the optical properties of the sample during the vacuum annealing step, comparing the optical properties of the sample to an end-point standard for the perovskite material, and stopping the reaction when the optical properties of the sample match the end-point standard.

11. A perovskite-based photovoltaic device, comprising:
    a first electrically conductive material on a substrate;
    a hole transporting material on the first electrically conductive material;
    a perovskite material formed on the hole transporting material by depositing a metal halide layer on the hole transporting material, and vacuum annealing the metal halide layer and methylammonium halide under conditions sufficient to form methylammonium halide vapor which reacts with the metal halide layer and forms a sample comprising the perovskite material on the hole transporting material, wherein the perovskite material has a thickness T of from about 20 nanometers to about 300 nanometers, and ranges therebetween, and an average grain size that is greater than 0.5T;
    an electron transporting material on the perovskite material; and
    a second electrically conductive material on the electron transporting material.

12. The perovskite-based photovoltaic device of claim 11, wherein the substrate is a transparent substrate.

13. The perovskite-based photovoltaic device of claim 12, wherein the substrate is selected from the group consisting of: a glass substrate, a quartz substrate and a sapphire substrate.

14. The perovskite-based photovoltaic device of claim 11, wherein the first electrically conductive material comprises ITO.

15. The perovskite-based photovoltaic device of claim 11, wherein the hole transporting material is selected from the group consisting of: PEDOT:PSS and $MoO_3$.

16. The perovskite-based photovoltaic device of claim 11, wherein the electron transporting material is selected from the group consisting of: PCBM, C60, and BCP.

17. The perovskite-based photovoltaic device of claim 11, wherein the second electrically conductive material comprises a material selected from the group consisting of: Al and Mg.

18. The perovskite-based photovoltaic device of claim 11, wherein the perovskite material has a thickness T of from about 100 nanometers to about 300 nanometers, and ranges therebetween.

19. The perovskite-based photovoltaic device of claim 11, wherein, as reaction of the methylammonium halide and the metal halide layer progresses, a color of the sample changes indicating a transition from metal halide to the perovskite material, and wherein changes in the color affect optical properties of the sample.

20. The perovskite-based photovoltaic device of claim 19, wherein the perovskite material is formed on the first hole transporting or electron transporting material further by monitoring in real-time the optical properties of the sample during the vacuum annealing step, comparing the optical properties of the sample to an end-point standard for the perovskite material, and stopping the reaction when the optical properties of the sample match the end-point standard.

* * * * *